(12) United States Patent
Ham

(10) Patent No.: US 7,281,094 B2
(45) Date of Patent: Oct. 9, 2007

(54) BALANCED BITCELL FOR A MULTI-PORT REGISTER FILE

(75) Inventor: Jung Hoon Ham, Arlington, TX (US)

(73) Assignee: VIA Technologies, Inc., Taipei (TW)

( * ) Notice: Subject to any disclaimer, the term of this patent is extended or adjusted under 35 U.S.C. 154(b) by 402 days.

(21) Appl. No.: 11/042,026

(22) Filed: Jan. 25, 2005

(65) Prior Publication Data

US 2006/0168406 A1    Jul. 27, 2006

(51) Int. Cl.
*G06F 11/4063*    (2006.01)
*G06F 11/4091*    (2006.01)
*G06F 11/4096*    (2006.01)
*G06F 11/4097*    (2006.01)

(52) U.S. Cl. .......................... 711/149; 365/51; 365/63; 365/154; 365/189.03; 365/189.05; 365/190; 365/202; 365/206; 365/214; 365/230.05; 365/230.06

(58) Field of Classification Search .................. 365/51, 365/63, 154, 189.03, 189.05, 189.08, 190, 365/202, 206, 214, 230.05, 230.06; 711/149
See application file for complete search history.

(56) References Cited

U.S. PATENT DOCUMENTS 5,289,427 A    2/1994    Nicholes et al.
5,812,486 A    9/1998    Shinmori

OTHER PUBLICATIONS

Chinese language office action dated Mar. 2, 2007.

*Primary Examiner*—Jack A. Lane
(74) *Attorney, Agent, or Firm*—Thomas, Kayden, Horstemeyer & Risley

(57) ABSTRACT

In a multi-port register file of a storage unit within a processor, an improved bitcell design for storing a data bit is disclosed. The bitcell comprises a first set of read bitlines having a first load and a second set of read bitlines having a second load, in which the second load is substantially equal to the first load. The bitcell also comprises a signal driving circuit having a first node and a second node. The first node is connected to the first set of read bitlines and the second node is connected to the second set of read bitlines.

3 Claims, 4 Drawing Sheets

BALANCED BITCELL FOR A MULTI-PORT REGISTER FILE

TECHNICAL FIELD

In general, the present disclosure relates to processors and register files for temporarily storing data within the processors. More particularly, the present disclosure relates to an improved circuit design for bitcells of multi-port register files.

BACKGROUND

A processor typically contains some type of storage system for temporarily storing data during processor operations. One of the temporary storage components embedded in the processor is referred to as a "register file." A register file usually includes a design that is unique to the specific processor. For instance, based on the design of the processor, register files may include multiple ports for allowing parallel accesses to data stored in the register file so that multiple reading and/or writing operations can be performed simultaneously. Currently, multi-port register files are typically configured with two or four ports. However, register files with a different number of ports have been contemplated.

Some of the ports of a multi-port register file are used as read ports and others are used as write ports. For example, a six-port register file may include two write ports and four read ports. Each port typically includes a number of "bitlines" leading to a corresponding number of input flip-flops or output flip-flops. From outside the register file, input flip-flops clock data into the register file via write bitlines. Data output from the register files is transmitted along read bitlines, and output flip-flops clock the data from the read bitlines to other components of the processor.

The number of bitlines and corresponding input and output flip-flops for each port is equal to the number of bits of the size of a data value that the register file is configured to handle. In an example of a data value having eight bits, each port of the multi-port register file will have eight bitlines leading to eight corresponding flip-flops. In order to increase data access speed, all eight bits of an eight-bit data value can be transferred in parallel along the parallel bitlines of a particular port between the flip-flops and eight corresponding "bitcells" within the register file. The data values from input flip-flops can be written to the bitcells of the register file and data values in the bitcells can be read to output registers. In a writing operation, the data values are transferred along the eight respective write bitlines of a particular input port from the input flip-flops to the bitcells. In a reading operating, the data values are transferred along eight respective read bitlines of a particular output port from the bitcells to the output flip-flops.

FIG. 1 is a schematic diagram of a conventional bitcell 10 for a six-port register file. The bitcell 10 includes two write bitlines WBL0, WBL1 and four read bitlines RBL0, RBL1, RBL2, RBL3. The bitcell 10 contains a driver 12, which drives all four read bitlines. The bitcell 10 also contains an inverter 14, also referred to herein as a keeper, connected in parallel with the driver 12 for transmitting signals in a direction opposite from the direction in which the driver 12 transmits signals. The write bitlines WBL0, WBL1 also contain drivers 16 and 18. Each of the write bitlines and read bitlines includes a transmission gate 20, i.e. a field effect transistor (FET), for controlling the transmission of data along the respective bitline. Each transmission gate 20 receives a control signal at its gate terminal for opening or closing the transmission gate 20. For example, on the read bitlines RBL0, RBL1, RBL2, and RBL3, the four respective FETs receive read wordline control signals RDWL0, RDWL1, RDWL2, and RDWL3. Also, the FETs 20 on the write bitlines WBL0 and WBL1 receive write wordline control signals WRWL0, WRWL1 on their respective gates.

This conventional bitcell 10 is configured such that its driver 12 drives all four read bitlines by itself, which can have several disadvantages. To maintain a fast processor speed, the driver 12 must be relatively large in order to be capable of driving the read bitlines. Since this element must be large, it is very likely that the conventional bitcell 10 will suffer from crosstalk coupling, in which the strong driving signals are coupled to the branch of the keeper 14 in an undesirable manner. Crosstalk coupling can also occur between the adjacent bitlines RBL0, RBL1, RBL2, RBL3. In addition, since the driver 12 is large, the size of the drivers 16 and 18 on the write bitlines will also need to be relatively large in order to drive the large driver 12 of the bitcell 10.

Another drawback of the conventional bitcell 10 is that the load driven by the driver 12 will vary depending on the status of the transmission gates 20. If the number of read wordlines RDWL0, RDWL1, RDWL2, RDWL3 that open the FET gates 20 is high, then the driver 12 will see a larger load. For instance, when a gate is closed, the driver 12 only sees one side of the FET 20 and when a gate is open, the driver 12 sees both sides. Therefore, the load can vary greatly based on the number of opened gates. As a result, the access time of the register file will vary, which creates a condition that makes it difficult to meet stringent timing specifications. Moreover, if timing specifications are not met, then the variable load condition may require that an additional compensation circuitry be added to yield a fixed access time. Not only does a compensation circuitry involve additional work to create it, but also such a circuit adds more delay to the output. These and other disadvantages of the prior art are overcome by the improved bitcell design as described below.

SUMMARY

In general, the present disclosure describes storage units of processors or microprocessors for temporarily storing data as its being processed. As an example, a processor described herein comprises one or more processing units, where each processing unit is configured to process data within the processor. The processor also includes a temporary storage unit in communication with the processing units. The temporary storage unit comprises a plurality of input flip-flops configured to receive data from the processing units, a multi-port register file having one or more write ports and two or more read ports, and a plurality of output flip-flops configured to transmit data to the processing units. Each of the write ports of the multi-port register file comprises multiple pairs of write bitlines in communication with the plurality of input flip-flops. Each of the read ports of the multi-port register file comprises multiple read bitlines in communication with the plurality of output flip-flops. Also, the multi-port register file comprises an array of bitcells, where each bitcell has a balanced configuration in which an equal number of read bitlines are connected on each side of a signal driving circuit. Each of the pairs of write bitlines comprises a first write bitline connected to a first side of the signal driving circuit and a second write bitline connected to a second side of the signal driving circuit. Lastly, the signal driving circuit comprises parallel branches of oppositely-directed drivers.

The present disclosure also discloses, in particular, the multi-port register files, which allow simultaneous data accesses. An example of a multi-port register file, as described herein, comprises one or more write ports, where each write port has multiple pairs of write bitlines for receiving data. The multi-port register file also includes two or more read ports, where each read port comprising multiple read bitlines for transmitting data. Also include is an array of bitcells, where each bitcell comprising a signal driving circuit having a first node and a second node. The first node is connected to a first set of the read bitlines and the second node is connected to a second set of the read bitlines. The signal driving circuit drives substantially equal loads on the first and second nodes.

Also described are the specific bitcells of the multi-port register file, each bitcell storing a data bit. One example of a bitcell includes a first set of read bitlines having a first load and a second set of read bitlines having a second load. The second load is configured to be substantially equal to the first load. The bitcell also includes a signal driving circuit having a first node and a second node, where the first node is connected to the first set of read bitlines and the second node is connected to the second set of read bitlines.

BRIEF DESCRIPTION OF THE DRAWINGS

Many aspects of the embodiments of the present disclosure can be better understood with reference to the following drawings. Like reference numerals designate corresponding parts throughout the several views.

DETAILED DESCRIPTION

The present disclosure comprises an improved bitcell design that can eliminate the drawbacks of the prior art. As described herein, a bitcell can be designed such that a pair of parallel drivers share the load of driving the multiple bitlines. In general, the single large driver 12 of the prior art is replaced with two smaller drivers. Also, the bitcell is configured with a balanced symmetry in which an equal bitline load is placed on opposite sides of the parallel drivers. In this regard, it can be seen that by sharing the load, the drivers might preferably be substantially equal in size and strength. By using smaller and substantially equal drivers, less power is consumed by the register file. Also, the overall size of the register file can be reduced, such that the issue of crosstalk can also be significantly reduced. Furthermore, the access time of the register file may increase. The design described herein includes additional FETs on the read bitlines for driving the bitlines, thereby easing the load for the drivers. This too will reduce crosstalk and will also require less power to operate.

Figure 1:
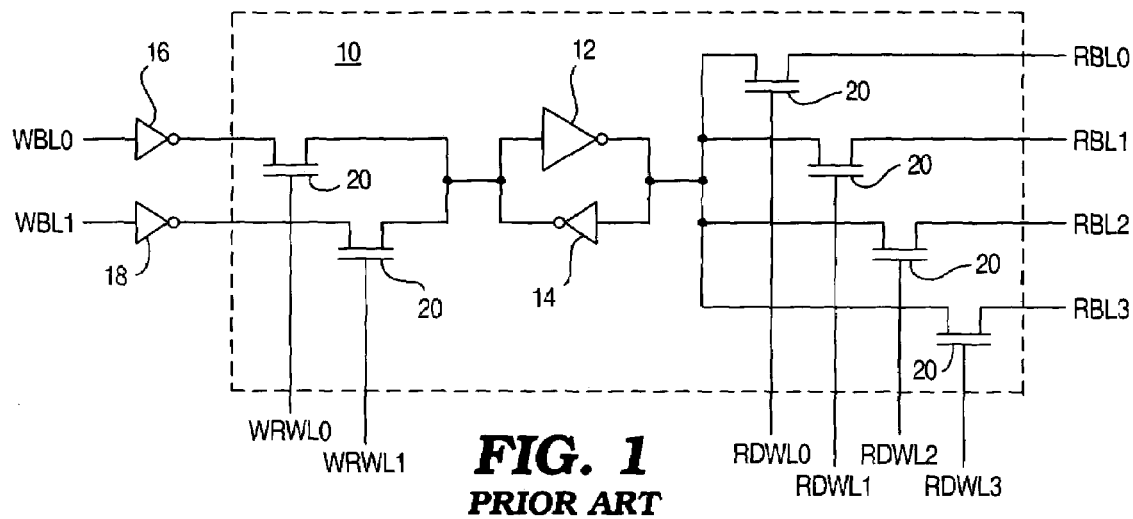
FIG. 1 is a schematic diagram of a conventional bitcell 10 for a six-port register file.
Figure 2:
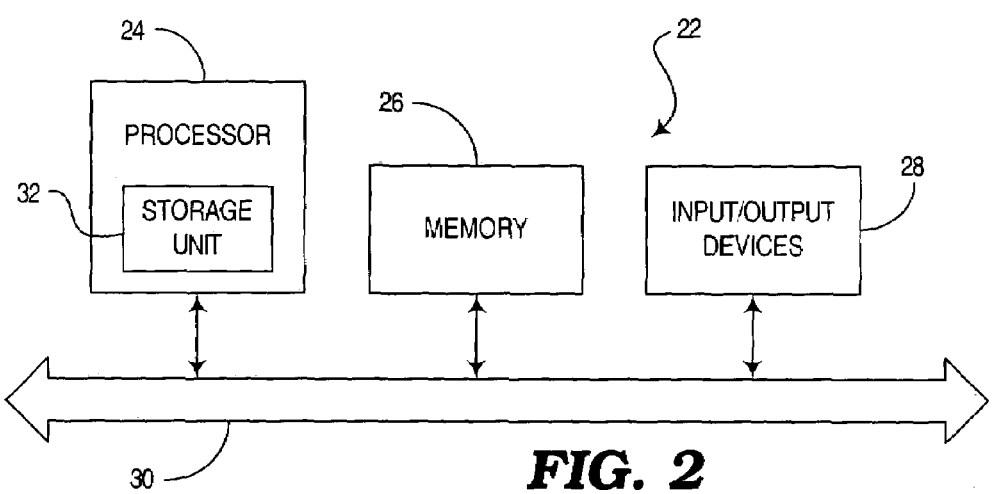
FIG. 2 is a schematic diagram of an embodiment of a processing system illustrating the environment in which an improved bitcell design of a register file can be incorporated.

FIG. 2 illustrates an embodiment of a processing system 22 showing the environment in which a register file comprising the improved bitcell design can be incorporated. The processing system 22 may be configured as any type of electronic device, such as, for example, a battery-operated hand-held device. Since power consumption is usually a concern when designing a processor driven by battery power, the processing system 22 having the improved register file and bitcell design, as described herein, can be used to minimize power.

The processing system 22 in this embodiment includes a processor 24, memory 26, and input/output devices 28, each interconnected via an internal bus 30. The processor 24 includes a storage unit 32 for temporarily storing data values within the processor 24. The processor 24 further includes, among other things, at least one data processing unit (not shown). Since one of ordinary skill in the art will understand the general features and operations of the data processing units, and also the memory 26 and input/output devices 28, these components will not be further described in this disclosure.

Figure 3:
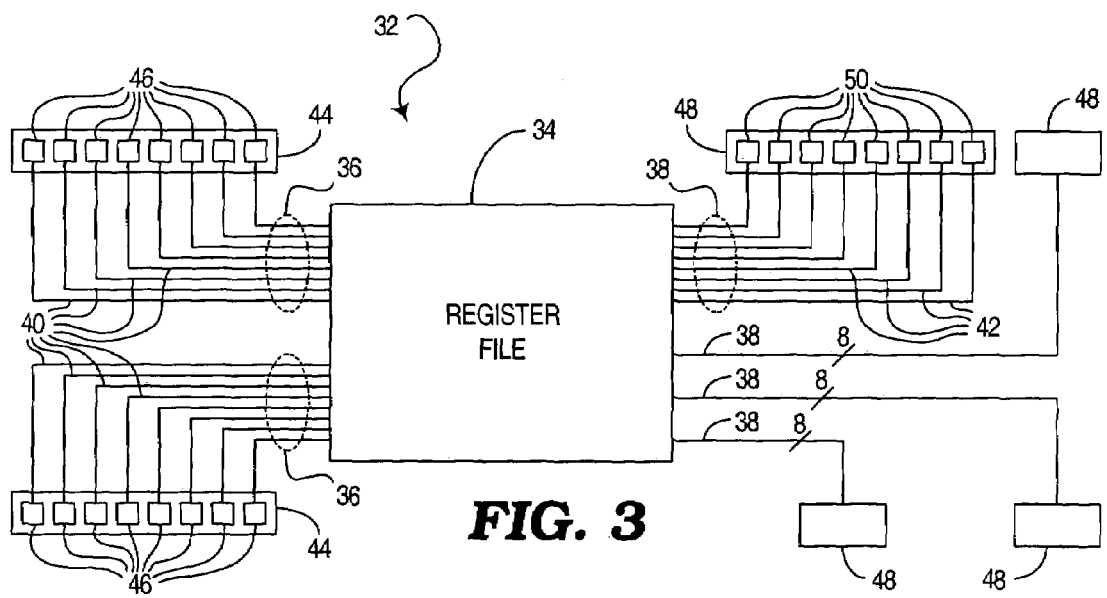
FIG. 3 is a schematic diagram of an embodiment of the storage unit shown in FIG. 2.

FIG. 3 is a schematic diagram of an embodiment of the storage unit 32 shown in FIG. 2. The storage unit 32 includes a register file 34, illustrated in this example as a multi-port register file, and more specifically as a six-port register file. The register file 34 in this embodiment includes two write ports 36 and four read ports 38, allowing simultaneous data accesses. Each write port 36 includes a number of pairs of write bitlines 40 and each read port 38 includes a number of read bitlines 42. It should be noted that the lines 40 as illustrated in FIG. 3 designate "pairs" of write bitlines. The read bitlines 42 are not paired as in the case of the write bitlines. In this embodiment, for example, the register file 34 includes eight pairs of write bitlines 40 on each write port 36 and eight read bitlines 42 on each read port 38. The pairs of write bitlines 40 of each write port 36 lead to a group 44 of input registers 46 corresponding to the number of pairs of write bitlines 40. Read bitlines 42 of the read ports 38 lead to groups 48 of output registers 50. For simplicity, only the read bitlines 42 and registers 50 of one group 48 are illustrated in FIG. 3. The input registers 46 and output registers 50 are preferably D-type flip-flops.

The number of pairs of write bitlines 40 along each write port 36, the number of read bitlines 42 along each read port 38, and the number of corresponding registers 46, 50 is equal to the number of bits of a data value that the register file 34 is configured to handle. In the exemplary embodiment of FIG. 3, this number is eight. The eight bits of the data can be transferred simultaneously along the eight parallel bitlines (or pairs of bitlines) of a particular port between the corresponding eight registers 46, 50 and "bitcells" of the register file 34. Also, with four read ports 38, four simultaneous data reads can be performed by four different data processing units (not shown) of the processor 24.

The data values in the input registers 46 are transferred to the bitcells of the register file 34 during a writing process and the data values in the bitcells can be transferred to the output registers 50 during a reading process. Data processing units of the processor 24 utilize the register file 34 (array of bitcells) for temporarily storing data that may be needed during processing operations. According to the embodiments of the register file 34 described herein, data in the register file 34 can be accessed by the processor 24 very quickly (in less than one clock cycle). Fast access of this data allows the processor 24 to meet strict access speed specifications. Also, if desired, the processor 24 may be designed such that the data is transferred along the bus 30 to memory 26 for relatively longer term storage if desired. In this regard, the input registers 46 and output registers 50 connect to the data processing units of the processor 24 for transferring data to or from the bitcells.

Figure 4:
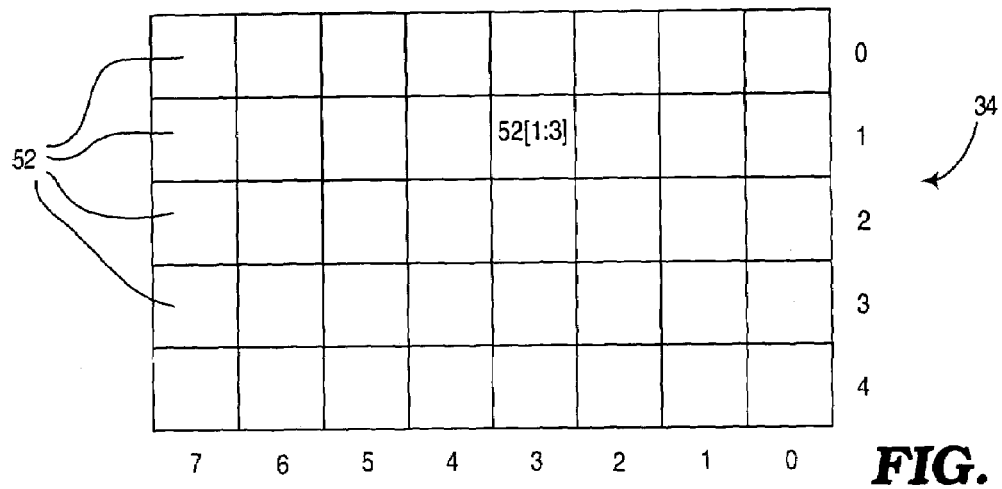
FIG. 4 is a diagram illustrating an embodiment of the register file having an array of bitcells.

FIG. 4 is a diagram illustrating a conceptual arrangement of an embodiment of the register file 34. Particularly, the embodiment shows the register file 34 having an array of bitcells 52. With the processor 24 configured to operate on eight-bit wide data values, for example, eight columns in the array are dedicated for storing the eight bits of the data. These columns are labeled 0 through 7 designating the bit position of the data values. In this embodiment, the array also includes five rows designating the number of addresses that can be accessed. For illustration purposes, these rows are labeled 0 through 4 for the data addresses. The identification of a bitcell 52 in the array of the register file 34, as defined herein, uses the notation "52[R:C]", where R is the row number and C is the column number. For example, the notation 52[1:3] represents the bitcell that stores the bit in the bit position "3" of the "1" address. It should be understood, however, that the number of bits in each row or column depends upon the particular design configuration of the processor and may be altered accordingly. In this embodiment, the bitcells are arranged in a 5×8 array, i.e. 40 bitcells, wherein each bitcell is capable of storing one bit.

Figure 5:
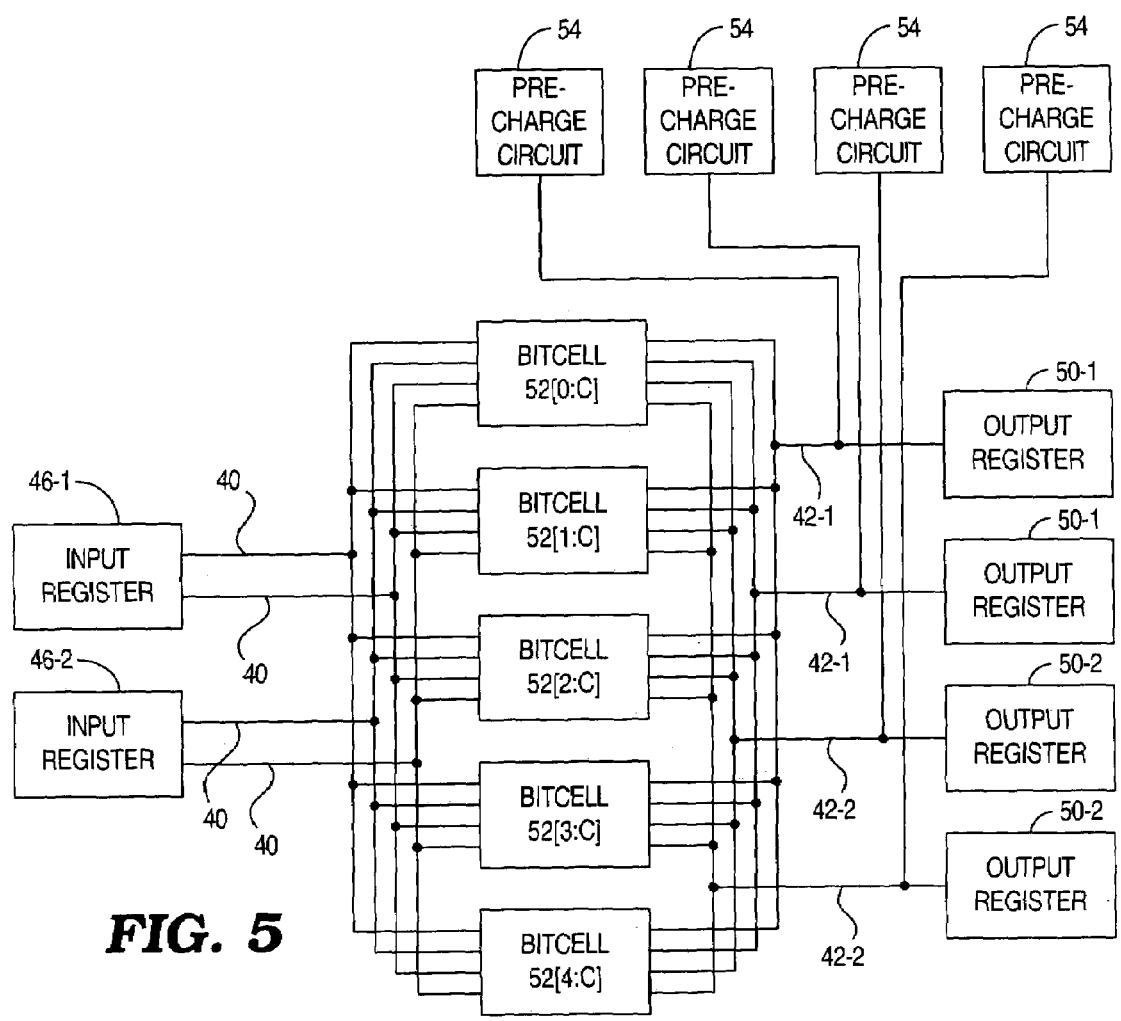
FIG. 5 is a schematic diagram of an embodiment of a circuit configuration of a column of bitcells connected in a six-port register file.

FIG. 5 is a schematic diagram of an embodiment of a circuit configuration showing how a column of bitcells 52[x:C] can be connected to the input registers 46 and output registers 50 in a six-port register file according to the teachings of the present disclosure. As can be seen, each bitcell 52 has four inputs and four outputs. The bitcells 52 are connected to the input registers 46 via write bitlines 40. In this example, and also as explained below with respect to FIG. 8, the first and third write bitlines are complementary and the second and fourth write bitlines are complementary. In other words, the third write bitline is inverted with respect to the first write bitline and the fourth write bitline is inverted with respect to the second write bitline.

The first inputs of the bitcells 52 are connected together and receive a first signal from a first input register 46-1. Also, the third inputs of the bitcells 52 are connected together and receive a second signal from the first input register 46-1. Likewise, the second and fourth inputs to each of the bitcells 52 are connected together for receiving first and second signals from a second input register 46-2. It should be noted that the order of bitcell inputs (first, second, third, fourth) is arbitrary and is used merely for illustrative purposes. The first input register 46-1 is located in the first group 44 (FIG. 3) of input registers 46 and the second input register 46-2 is located in the second group 44. The input registers 46-1 and 46-2 are arranged in the C column position of their respective group 44 of input registers 46.

Also, the four outputs from each of the bitcells 52 are connected to the four respective output registers 50 via read bitlines 42. The first through fourth output registers 50 are located in the first through fourth groups 48 of output registers (FIG. 3), respectively, and are arranged in the C column position of their respective group 48. The two read bitlines 42-1 are actually configured within the bitcell 52 on a first side of the bitcell and the other two read bitlines 42-2 are configured on the other side. This arrangement will become more evident from an understanding of the description of FIG. 9 below.

Each read bitline 42 is connected to a respective pre-charge circuit 54. The pre-charge circuit 54 charges the read bitlines 42 to a high level and maintain the bitlines at the high level until one of the bitcells 52 of the column drives the bitline high or low.

In the embodiment of FIG. 5, the five parallel bitcells 52[0:C], 52[1:C], 52[2:C], 52[3:C], 52[4:C] are the five bitcells of one column C of the array shown in FIG. 4. As explained above, the register file 34 may be configured with any suitable number of addresses. Consequently, depending on the number of addresses, the embodiment of FIG. 5 may be changed accordingly to accommodate the proper number of bitcells by simply adding bitcells in parallel with the rest of the column.

Figure 6:
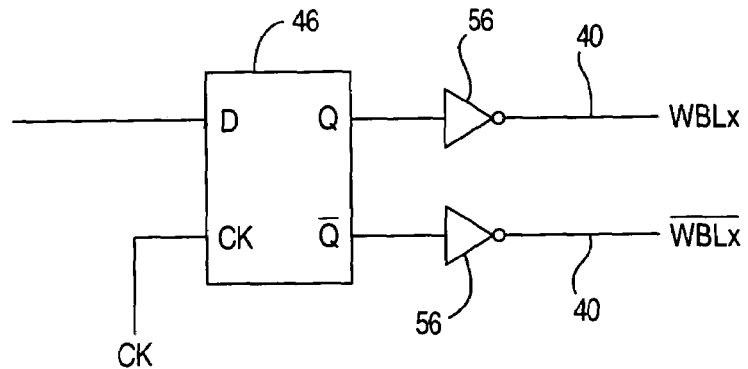
FIG. 6 is a schematic diagram of an embodiment of an input register and corresponding pre-charge circuits.

FIG. 6 is a schematic diagram of an embodiment of one of the input registers 46. Although the input registers 46 may comprise any suitable components, the input register 46 in this embodiment is configured as a D-type flip-flop. The D input of the flip-flop receives a data signal to be written. The Q output drives the primary write bitline WBLx high or low when the clock CK is high. The complementary write bitline $\overline{WBLx}$ receives the complementary $\overline{Q}$ output, which drive this bitline. Buffers 56 are located on the write bitlines WBLx and $\overline{WBLx}$ to assist the flip-flop in driving the data along the bitlines.

Figure 7:
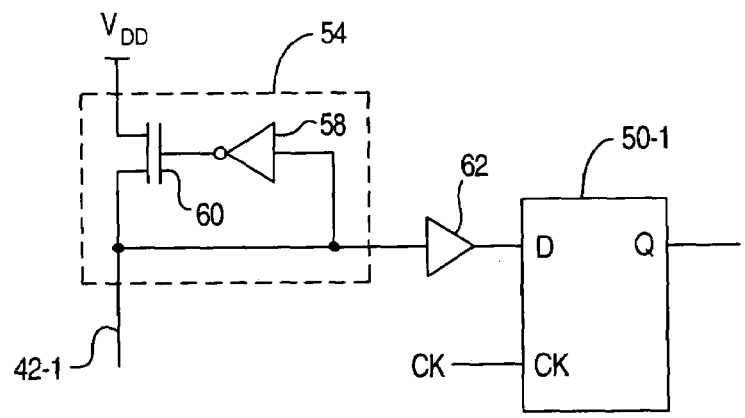
FIG. 7 is a schematic diagram of an embodiment of an output registers on a first side of a bitcell and its corresponding pre-charge circuit.

FIG. 7 is a schematic diagram of an embodiment of one of the output registers 50-1 along a respective read bitline 42-1 and a corresponding pre-charge circuit 54 connected to the read bitline 42-1. As will be more evident from an understanding of the description of FIG. 9, the output register 50-1 is located on a first side of the bitcell. The pre-charge circuit 54 includes a keeper 58, configured as an inverter, and an FET 60 connected to $V_{DD}$. The pre-charge circuit 54 is connected to the bitline 42-1 for maintaining the line high when not being driven by the bitcell 52. The read bitline 42-1 on the first side of the bitcell includes a buffer 62, or amplifier, for amplifying the signal that is input into the output register 50-1.

Figure 8:
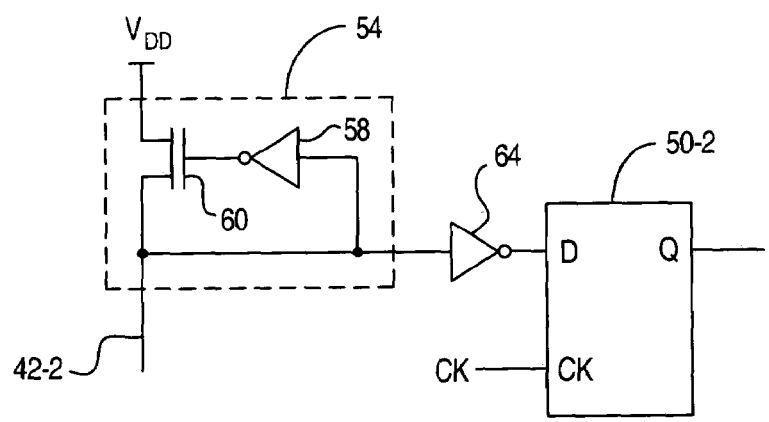
FIG. 8 is a schematic diagram of an embodiment of another output register on a second side of the bitcell and its corresponding pre-charge circuit.

FIG. 8 is a schematic diagram of an embodiment of another one of the output registers 50-2 along a respective read bitline 42-2 and its corresponding pre-charge circuit 54. In this embodiment, the output register 50-2 is located on a second side of the bitcell. Again, the pre-charge circuit 54 maintains the bitline high when it is not being driven by the respective bitcell 52. This embodiment is substantially the same as the embodiment shown in FIG. 7 except that the buffer 62 of FIG. 7 is replaced with an inverter 64. The inverter 64 provides the same amplification as the buffer 62 but further inverts the signal to account for the fact that the read bitlines 42-1 on the first side of the bitcell (FIG. 7) are driven by a first driver (as explained below) and the read bitlines 42-2 on the second side of the bitcell (FIG. 8) are driven by a second driver (as explained below) that inverts signals with respect to the first side, which results in bitlines 42-1 on one side being driven high when the bitlines 42-2 on the other side are driven low, and vice versa.

Figure 9:
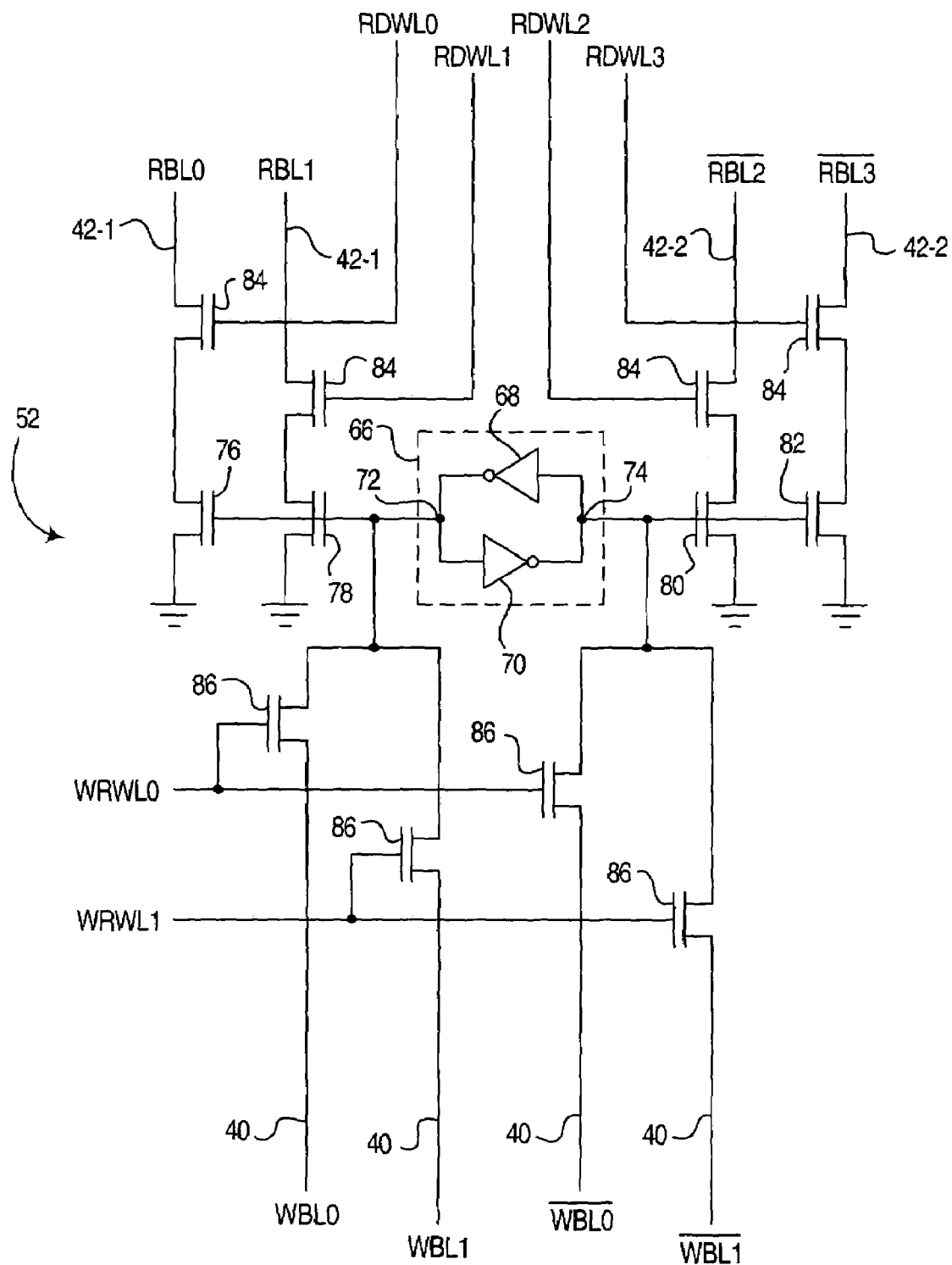
FIG. 9 is a schematic diagram of an embodiment of an improved bitcell for a six-port register file according to the teachings of the present disclosure.

FIG. 9 is a schematic diagram of an embodiment of an improved bitcell 52 for a six-port register file according to the teachings of the present disclosure. Although this embodiment is a six-port register file, one of ordinary skill in the art will understand that alternative embodiments may be constructed having any number of ports. In this embodiment, the bitcell 52 comprises, at its center, a signal driving circuit 66 having parallel branches of oppositely-directed drivers 68 and 70. The output of the first driver 68 is connected to a first node 72 and its input is connected to a second node 74. The second driver 70 is connected with its input at the first node 72 and its output at the second node 74.

The first driver 68 provides control signals to transmission gates 76 and 78 on a first side of the bitcell 52 for controlling a first set of read bitlines RBL0 and RBL1. The second driver 70 provides control signals to transmission gates 80 and 82 on the other side of the bitcell 52 for controlling a second set of read bitlines $\overline{RBL2}$ and $\overline{RBL3}$. Each transmission gate 76, 78, 80, and 82 may be configured as an FET or other suitable switching device. When the respective read bitline is enabled by read wordlines RDWL0, RDWL1, the transmission gates 76 and 78 ground the read bitlines RBL0 and RBL1, respectively, in response to an active control signal from the first driver 68. When the respective read bitline is enabled by read wordlines RDWL2, RDWL3, the transmission gates 80 and 82 ground the read bitlines $\overline{RBL2}$ and $\overline{RBL3}$, respectively, in response to the control signal from the second driver 70.

Although this embodiment is drawn to a six-port bitcell 52, it should be recognized that the bitcell 52 may be configured according to a number of different alterations. For example, the bitcell may include any number of ports. In order to maintain the balance of the design, however, it is preferable that an equal number of read bitlines are provided on either side of the bitcell. For example, with a bitcell having four, six, or eight, bitlines, etc., two, three, or four bitlines, respectively, would be placed on each side of the bitcell. Alternatively, a different number of bitlines may be positioned on opposite sides as long as the circuit is designed such that the drivers 68 and 70 have substantially equal or balanced loads. In this regard, the drivers are preferably equal in size and driving capacity.

It may be noticed that the design configuration of FIG. 9 includes twice as many FETs as is used in the prior art. More particularly, for a six-port design, the number of FETs increases from six to twelve. Even so, since the size of the drivers 68 and 70 can be significantly reduced, the total size of the bitcell 52 can be reduced by 10-30%. Also, since the bitlines in this embodiment are driven by the transmission gates 76, 78, 80, 82, and not by the one large driver 12 of the prior art, the driving strength is actually increased with respect to the prior art. Moreover, with a smaller size and stronger driving strength, the bitcell 52 can provide faster read access time with respect to the prior art. Also, because of the symmetry of the circuit design of the bitcell 52, the area required for metal routing can be reduced, thereby further reducing the total size of the bitcell 52.

Also configured on each of the read bitlines is an additional transmission gate 84, e.g. FET. These FETs 84 are driven by the read wordlines RDWL0, RDWL1, RDWL2, and RDWL3 for enabling the respective read bitlines.

FIG. 9 further includes two pairs of write bitlines WBL0 and $\overline{WBL0}$, and WBL1 and $\overline{WBL1}$, in which each write bitline of the pair is connected on opposite sides of the bitcell 52. With this arrangement, any number of pairs of write bitlines may be used. Even with an odd number of write ports, the bitcell 52 is designed such that complementary pairs are located on opposite sides so that the bitcell 52 remains balanced. By placing one write bitline on each side, the crosstalk coupling can also be reduced. Each one of the write wordlines WRWL0 and WRWL1 is connected to two transmission gates 86, e.g. FETs, each of which is connected to one of the pair of respective write bitlines 40 for a particular write port.

In operation, one of the buffers 56 (FIG. 6) transmits a primary signal from an input register 46 along a respective write bitline 40 WBLx. The corresponding buffer 56 also transmits the complement of the primary signal from the same input register 46 to the complementary write bitline 40 $\overline{WBLx}$ on the opposite side of the bitcell 52. When enabled by the respective transmission gates 86 in response to an active signal on the corresponding write wordline (WRWL0 or WRWL1), the signal and its complement are driven onto opposite sides of the signal driving circuit 66. This symmetrical writing scheme requires less power than the prior art and does not suffer from undesirable variable load conditions. It also allows data to be more quickly written to the bitcell. The writing speed may increase by about 20% compared to the prior art when the same size drivers are used. However, the driver size may further be reduced in this configuration and still be able to provide the same driving force of the prior art. In this case, the operating speed may be increased by an even greater amount, i.e. about 30%-40% faster than the prior art.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A processor comprising:
   one or more processing units, each processing unit configured to process data within the processor;
   a temporary storage unit in communication with the one or more processing units, the temporary storage unit comprising:
      a plurality of input flip-flops configured to receive data from the one or more processing units;
      a multi-port register file having one or more write ports and two or more read ports; and
      a plurality of output flip-flops configured to transmit data to the one or more processing units;
   wherein each of the one or more write ports of the multi-port register file comprises multiple pairs of write bitlines in communication with the plurality of input flip-flops, and each of the two or more read ports of the multi-port register file comprises multiple read bitlines in communication with the plurality of output flip-flops; and
   wherein the multi-port register file comprises an array of bitcells, each bitcell having a balanced configuration in which an equal number of read bitlines are connected on each side of a signal driving circuit, and each of the pairs of write bitlines comprises a first write bitline connected to a first side of the signal driving circuit and a second write bitline connected to a second side of the signal driving circuit, the signal driving circuit comprising parallel branches of oppositely-directed drivers.

2. The processor of claim 1, wherein the register file comprises two write ports and four read ports.

3. The processor of claim 1, wherein the processor is configured to operate in a battery-powered electronic device.

* * * * *